United States Patent
Choi

(10) Patent No.: US 10,249,566 B2
(45) Date of Patent: Apr. 2, 2019

(54) SEMICONDUCTOR DEVICE INCLUDING FUSE STRUCTURE

(71) Applicant: Samsung Electronics Co., Ltd., Suwon-si (KR)

(72) Inventor: Hyun-Min Choi, Uiwang-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/914,142

(22) Filed: Mar. 7, 2018

(65) Prior Publication Data

US 2018/0197817 A1     Jul. 12, 2018

Related U.S. Application Data

(63) Continuation of application No. 15/228,498, filed on Aug. 4, 2016, now Pat. No. 9,953,919.

(30) Foreign Application Priority Data

Aug. 12, 2015  (KR) ........................ 10-2015-0113795

(51) Int. Cl.
*H01L 23/525* (2006.01)
*H01L 23/528* (2006.01)
*H01L 23/522* (2006.01)
*H01L 23/532* (2006.01)

(52) U.S. Cl.
CPC ........ *H01L 23/5256* (2013.01); *H01L 23/528* (2013.01); *H01L 23/5226* (2013.01); *H01L 23/53214* (2013.01); *H01L 23/53233* (2013.01); *H01L 23/53257* (2013.01)

(58) Field of Classification Search
CPC ............ H01L 23/5256; H01L 23/5226; H01L 23/528; H01L 21/565–21/566; H01L 27/11206; G11C 17/16–17/165
See application file for complete search history.

(56) References Cited

U.S. PATENT DOCUMENTS

| | | | |
|---|---|---|---|
| 8,159,041 B2 | 4/2012 | Saitou | |
| 8,299,567 B2 | 10/2012 | Wang et al. | |
| 8,304,853 B2 | 11/2012 | Kim | |
| 8,421,186 B2 | 4/2013 | Li et al. | |
| 8,922,328 B2 | 12/2014 | Wu et al. | |
| 9,214,245 B2 | 12/2015 | Choi | |
| 2009/0179302 A1 | 7/2009 | Kothandaraman et al. | |

(Continued)

FOREIGN PATENT DOCUMENTS

CN          105304610 A      2/2016

*Primary Examiner* — Brigitte A Paterson
(74) *Attorney, Agent, or Firm* — Muir Patent Law, PLLC

(57) ABSTRACT

An eFuse structure of a semiconductor device may include a first metal formed at a first level on a substrate, a second metal formed at a second level between the first level and the substrate, a third metal formed at a third level between the second level and the substrate, a first via connecting the first metal to the second metal, and a second via connecting the second metal to the third metal. The first metal may include a first portion extending in a first direction, a second portion extending in the first direction and being adjacent to the first portion, and a third portion connecting the first portion to the second portion. A first distance between the first portion and the second portion may be greater than a width of the second portion in a second direction perpendicular to the first direction.

8 Claims, 13 Drawing Sheets

(56) References Cited

U.S. PATENT DOCUMENTS

| | | |
|---|---|---|
| 2009/0267723 A1 | 10/2009 | Hwang et al. |
| 2010/0163833 A1 | 7/2010 | Borghi et al. |
| 2011/0241162 A1 | 10/2011 | Kurz et al. |
| 2012/0154102 A1 | 6/2012 | Chen |
| 2012/0194316 A1 | 8/2012 | Park |

SEMICONDUCTOR DEVICE INCLUDING FUSE STRUCTURE

CROSS-REFERENCE TO RELATED APPLICATION

This application is a Continuation of U.S. patent application Ser. No. 15/228,498, filed on Aug. 4, 2016, now allowed, which claims priority under 35 U.S.C. § 119 to Korean Patent Application No. 10-2015-0113795 filed on Aug. 12, 2015 in the Korean Intellectual Property Office, the contents of which in its entirety are herein incorporated by reference.

BACKGROUND

1. Technical Field

The present disclosure relates to a semiconductor device, and more particularly, to a semiconductor device comprising an eFuse structure.

2. Description of the Related Art

In the semiconductor industry, fuses are typically used to achieve a variety of purposes. Taking memory devices for example, fuses may be used in repair processes in which bad memory cells are replaced with redundancy memory cells to enhance chip yield. In addition to the repair process, fuses can be used for chip identification such as writing information about fabrication history of respective chips, or for chip customization such as optimizing characteristics of respective chips in the subsequent steps following the fab-out.

The fuses may include a laser fuse blown using laser and an electrical fuse (i.e., eFuse) blown by applying a voltage thereto. In general, it is desirable to blow a fuse completely and efficiently though a low voltage is provided to the fuses.

SUMMARY

Embodiments of the present disclosure provide a semiconductor device comprising an eFuse structure that may have enhanced fusing performance that allows programming at low voltage.

The objectives that are intended to be addressed by the present disclosure are not limited to that mentioned above, and other objectives that are not mentioned above can be clearly understood to those skilled in the art based on the description provided below.

According to an aspect of the present invention, there is provided a semiconductor device comprising a substrate including a first region and a second region; an eFuse structure formed in the first region; and an interconnect structure formed in the second region, wherein the eFuse structure includes a first metal pattern formed at a first vertical level on the substrate, a second metal pattern formed at a second vertical level between the first vertical level and the substrate, a third metal pattern formed at a third vertical level between the second vertical level and the substrate, a first via electrically connecting the first metal pattern to the second metal pattern, and a second via electrically connecting the second metal pattern to the third metal pattern, the first metal pattern includes a first portion extending in a first direction, a second portion extending in the first direction and being adjacent to the first portion, and a third portion extending in a second direction perpendicular to the first direction and electrically connecting the first portion to the second portion, the first via electrically connects the first portion to the second metal pattern, the interconnect structure includes a first wire and a second wire being adjacent to each other and formed at the same vertical level on the substrate, no conductive wire is formed between the first wire and the second wire, a first distance between the first portion and the second portion of the first metal pattern is different from a second distance between the first wire and the second wire, and a sum of a width of the second portion of the first metal pattern in the second direction and the first distance is equal to a sum of a width of the first wire in the second direction and the second distance.

In some embodiments of the present disclosure, the first metal pattern further includes a fourth portion extending in the first direction and being adjacent to the second portion, the fourth portion is not electrically connected to the first portion, the second portion and the third portion, and the second portion is disposed between the first portion and the fourth portion.

In some embodiments of the present disclosure, the first distance is greater than the width of the second portion of the first metal pattern.

In some embodiments of the present disclosure, a width of the first via in the first direction is greater than a width of the first portion in the second direction.

In some embodiments of the present disclosure, the first wire is elongated in the first direction, and the width of the first wire is greater than the width of the second portion of the first metal pattern.

In some embodiments of the present disclosure, the second metal pattern extends in the second direction.

In some embodiments of the present disclosure, the second metal pattern includes a fourth portion extending in the second direction, and a fifth portion extending in the second direction and being formed on both sides of the fourth portion, the fourth portion is physically connected to the first metal pattern and the third metal pattern, and the fifth portion is not physically connected to the fourth portion.

In some embodiments of the present disclosure, the third metal pattern includes a fourth portion and a fifth portion adjacent to each other, and a sixth portion connecting the fourth portion to the fifth portion, and the second via electrically connects the second metal pattern to the fourth portion.

In some embodiments of the present disclosure, the third metal pattern further includes a seventh portion opposite to the sixth portion.

In some embodiments of the present disclosure, the first metal pattern further includes a fourth portion extending in the first direction and being adjacent to the first portion, and a fifth portion physically connecting the second portion to the fourth portion, and the first portion is disposed between the second portion and the fourth portion.

In some embodiments of the present disclosure, a positive voltage is applied to the first metal pattern and a negative voltage is applied to the third metal pattern.

According to another aspect of the present invention, there is provided a semiconductor device comprising a substrate including a first region and a second region; an eFuse structure formed in the first region; and an interconnect structure formed in the second region, wherein the eFuse structure includes a first metal pattern formed at a first vertical level on the substrate, a second metal pattern formed at a second vertical level between the first vertical level and the substrate, a third metal pattern formed at a third vertical level between the second vertical level and the substrate, a first via physically connecting the first metal pattern to the second metal pattern, and a second via physically connecting the second metal pattern to the third metal pattern, the first metal pattern includes a first bent portion in a U shape, and a first auxiliary pattern extending in a first direction and being adjacent to and electrically isolated from the first bent portion, the first bent portion includes a first portion which extends in the first direction and is electrically connected to the first via, and a second portion extending in the first direction and being adjacent to the first portion, the first portion is disposed between the second portion and the first auxiliary pattern, and a first distance between the first portion and the second portion spaced apart from the first portion is greater than a width of the second portion in a second direction perpendicular to the first direction.

In some embodiments of the present disclosure, the interconnect structure includes a first wire and a second wire formed at the same vertical level on the substrate and adjacent to each other, the first wire and the second wire extend in the first direction, respectively, the first wire and the second wire are spaced apart from each other in the second direction by a second distance, a sum of a width of the first portion and the first distance is equal to a sum of a width of the second wire in the second direction and the second distance, and the width of the first portion is smaller than the width of the second wire.

In some embodiments of the present disclosure, the second metal pattern includes a fourth portion extending in the second direction, and a fifth portion extending in the second direction and being formed on both sides of the fourth portion, the fourth portion is physically connected to the first metal pattern and the third metal pattern, and the fifth portion is not physically connected with the fourth portion.

In some embodiments of the present disclosure, the third metal pattern includes a second bent portion in U shape.

According to still another aspect of the present invention, there is provided a semiconductor device comprising a substrate including a first region and a second region; an eFuse structure formed in the first region; and an interconnect structure including a first wire and a second wire adjacent to the first wire, and formed in the second region, wherein: the eFuse structure includes a first metal pattern formed at a first vertical level on the substrate, a second metal pattern formed at a second vertical level between the first vertical level and the substrate, a third metal pattern formed at a third vertical level between the second vertical level and the substrate, a first via electrically connecting the first metal pattern to the second metal pattern, and a second via electrically connecting the second metal pattern to the third metal pattern, the first metal pattern includes a first bent portion in a U shape, the first bent portion includes a first portion extending in the first direction and being electrically connected to the first via, and a second portion extending in the first direction and being adjacent to the first portion, a first distance between the first portion and the second portion in a second direction perpendicular to the first direction is greater than a second distance between the first wire and the second wire in the second direction, and a first width of the second portion in the second direction is smaller than a second width of the first wire in the second direction.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
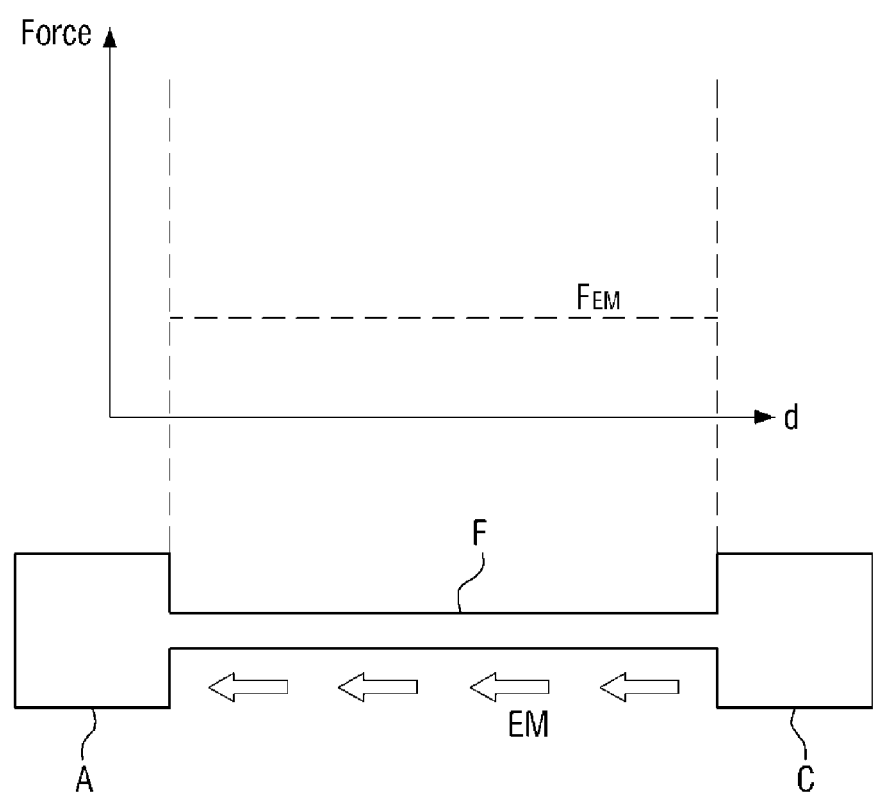
FIG. 1 is a diagram provided to explain an effect of electromigration in a process of programming an eFuse structure included in a semiconductor device according to exemplary embodiments.

Advantages and features of the present disclosure and methods of accomplishing the same may be understood more readily by reference to the following detailed description of example embodiments and the accompanying drawings. The present inventive concept may, however, be embodied in many different forms and should not be construed as being limited to the embodiments set forth herein. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to," "directly coupled to" or "directly physically connected to" another element or layer, there are no intervening elements or layers present. The term "contacting" refers to a direct connection (i.e., touching), unless the context indicates otherwise. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinbelow, with reference to FIGS. 1 to 3, the thermally-assisted electromigration mode, which is utilized in the programming process of an eFuse structure included in a semiconductor device according to exemplary embodiments, will be described.

FIG. 1 is a diagram provided to explain an effect of electromigration in a process of programming an eFuse structure included in a semiconductor device according to exemplary embodiments. FIG. 2 is a diagram provided to explain an effect of thermomigration in a process of programming an eFuse structure included in a semiconductor device according to exemplary embodiments. FIG. 3 is a diagram provided to explain effects of electromigration and thermomigration in a process of programming an eFuse structure included in a semiconductor device according to exemplary embodiments.

Figure 3:
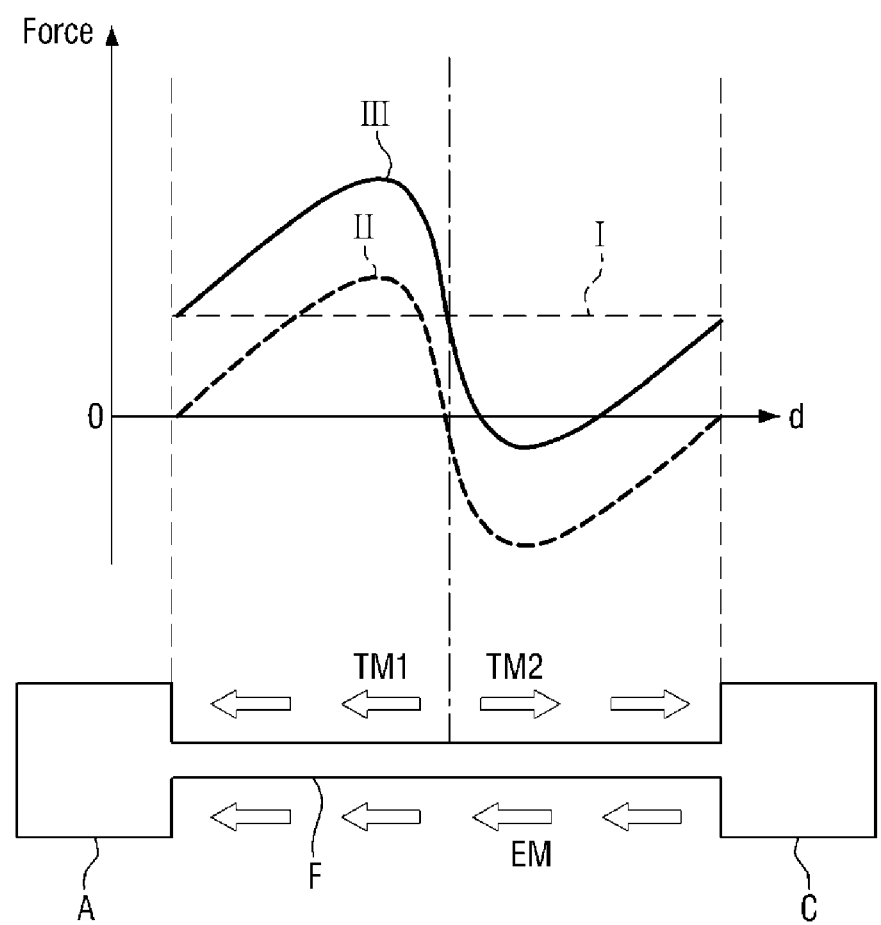
FIG. 3 is a diagram provided to explain effects of electromigration and thermomigration in a process of programming an eFuse structure included in a semiconductor device according to exemplary embodiments.

More specifically, a line I in FIG. 3 represents a driving force by electromigration in a fuse link when an eFuse structure is programmed. A curved line II in FIG. 3 represents a driving force by thermomigration expressed by differentiated temperature distribution in a fuse link when an eFuse structure is programmed. A curved line III in FIG. 3 represents a net driving force by a combination of the thermomigration and the electromigration.

The eFuse structure included in the semiconductor device according to exemplary embodiments is a stacked eFuse structure of which the fuse link F also has a stacked structure. However, for convenience of explanation, the fuse link F in FIGS. 1 to 3 is illustrated as a linear fuse link.

Programming an eFuse structure includes providing a fuse link F with a programming current, by applying a predetermined voltage between a cathode C and an anode A. For the purpose of eFuse structure programming, a negative voltage may be applied to the cathode C, and a positive voltage may be applied to the anode A. Accordingly, electron flow may occur in the fuse link F in a direction from the cathode C to the anode A. When electrons transport in the fuse link F, electromigration (EM) phenomenon can occur as the electrons collide into the constituent atoms of the fuse link F, causing the atoms to move.

While FIG. 1 illustrates the driving force by electromigration (i.e., electromigration driving force FEM) as being uniformly distributed across the entire area irrespective of locations in the fuse link F, this is only for illustrative purpose and exemplary embodiments are not limited thereto. For example, it is of course possible that the driving force by electromigration in the fuse link F can be changed in the fuse link F by changing cross sectional area of the fuse link F.

In addition, the fuse link F may be formed of metallic material such as tungsten, aluminum and copper, and with the provision of a programming current to this fuse link F, the fuse link F may generate Joule's heat by the programming current. The Joule's heat generated by the programming current may have non-uniform temperature distribution in the fuse link F as illustrated in FIG. 2. The non-uniform temperature distribution in the fuse link F may have the highest temperature at a center of the fuse link F. As described above, the non-uniform temperature distribution may cause thermomigration phenomenon (TM1, TM2) of the atoms in the fuse link F. The thermomigration phenomenon includes a first thermomigration TM1 of atoms migrating from the center of the fuse link F toward the anode A, and a second thermomigration TM2 of atoms migrating from the center of the fuse link F toward the cathode C.

Referring to FIG. 3, the driving force by electromigration (i.e., electromigration driving force FEM) in the fuse link may be provided uniformly across the entire area, irrespective of the locations in the fuse link. Additionally, because the fuse link has non-uniform temperature distribution, driving forces (i.e., thermomigration driving force FTM) may act on both sides around the center of the fuse link by the opposite thermomigrations.

Between the anode A and the center of the fuse link F, the direction of atomic movement by the electromigration (EM) is identical to the direction of atomic movement by the first thermomigration (TM1). Accordingly, the electromigration driving force combined with the thermomigration driving force may result in an increased net driving force (FEM+TM) exerted into the fuse link F.

On the contrary, between the cathode C and the center of the fuse link F, the direction of atomic movement by the electromigration (EM) is opposite to the direction of atomic movement by the second thermomigration (TM2). Accordingly, the electromigration driving force combined with the thermomigration driving force may result in a decreased net driving force (FEM+TM) exerted into the fuse link F.

As illustrated in FIG. 3, due to the non-uniform temperature distribution in the fuse link F, the thermomigration driving force and the electromigration driving force combined with each other can generate flux divergences (in other words, non-uniform atomic flow rates). Then, the regions having flux divergences may have atom depletion or accumulation.

More specifically, atoms can be depleted and result in formation of a void, when a region of the fuse link F has a larger out-flowing flux of atoms than in-flowing flux of atoms. On the contrary, when the region of the fuse link F has a larger in-flowing flux of atoms than out-flowing flux of atoms, the atoms may be accumulated to form hill-locks. As described above, voids formed due to the flux divergences increase resistance of the fuse link F, and the increased resistance of the fuse link F causes the eFuse structure to be programmed.

Accordingly, when programming the eFuse structure, formation of the voids by the atom depletion may be accelerated as larger flux divergence is provided into the fuse link F.

It is therefore possible to provide an eFuse structure which is capable of providing larger flux divergence, by adjusting net driving force provided to the fuse link F. Additionally, in the eFuse structure designing stage, a region may be provided in the fuse link F that can provide a large flux divergence, so that an eFuse structure which can adjust a site of void formation by the atom depletion is provided.

Figure 4:
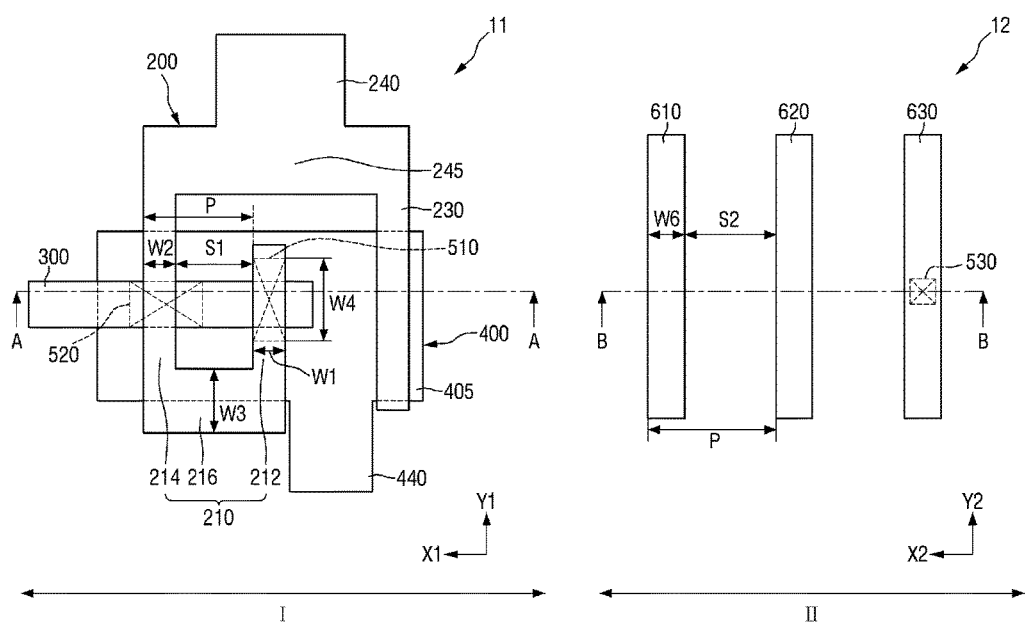
FIGS. 4 and 5 are diagrams provided to explain a structure of a semiconductor device according to some exemplary embodiments.
Figure 5:
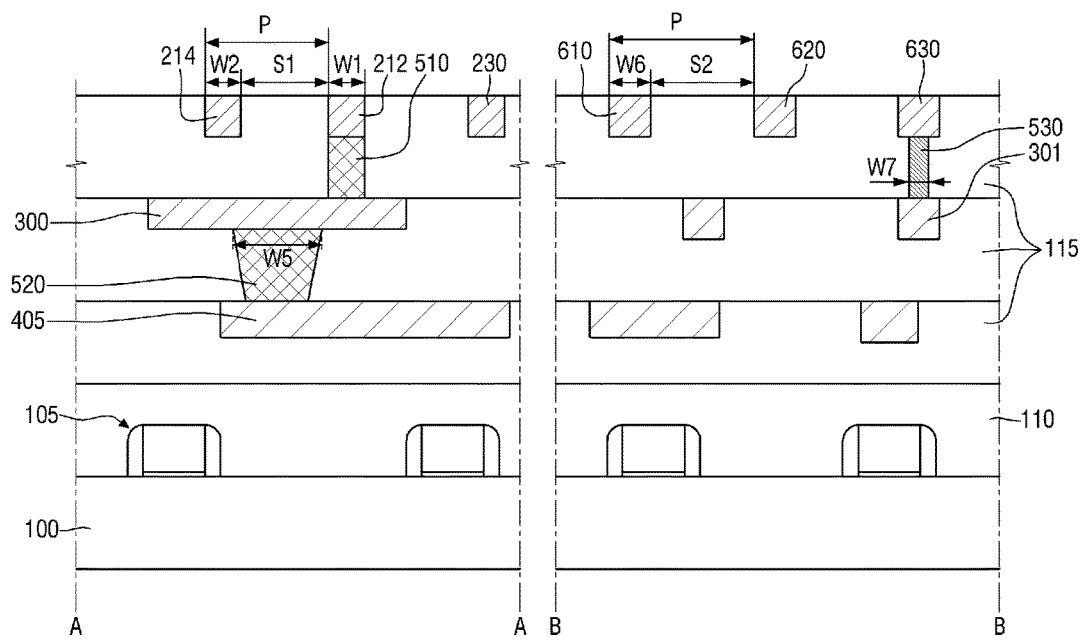

FIGS. 4 and 5 are diagrams provided to explain a structure of a semiconductor device according to some exemplary embodiments.

Specifically, FIG. 4 is a top view of a first structure of a semiconductor device according to some exemplary embodiments. FIG. 5 is a cross sectional view taken on lines A-A and B-B of FIG. 4. For convenience of explanation, FIGS. 4 and 5 illustrate only the eFuse structure and certain parts of an interconnect structure in the semiconductor device. As used herein, a semiconductor device may refer, for example, to a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronics device, etc.

Referring to FIGS. 4 and 5, the semiconductor device according to some exemplary embodiments may include an eFuse structure 11 and an interconnect structure 12.

A substrate 100 may include a first region I and a second region II. The first region I and the second region II may be the regions adjacent to, or spaced apart from each other (e.g., spaced apart horizontally).

For example, the eFuse structure 11 may be formed in the first region I of the substrate 100, and the interconnect structure 12 may be formed in the second region II of the substrate 100.

The substrate 100 may be a bulk silicon or a silicon-on-insulator (SOI). Alternatively, the substrate 100 may be a silicon substrate, or may include other substance such as, for example, germanium, silicon germanium, indium antimonide, lead telluride compound, indium arsenide, indium phosphide, gallium arsenide, or gallium antimonide, but is not limited thereto.

A circuit pattern 105 may be formed on the substrate 100 or within the substrate 100. The circuit pattern 105 may form a circuit device. The circuit device may form a plurality of memory devices. For example, the memory device may be a volatile semiconductor memory device and a non-volatile semiconductor memory device. The volatile semiconductor memory device may be, for example, DRAM, SRAM, and so on. The non-volatile semiconductor memory device may be, for example, EPROM, EEPROM, Flash EEPROM, MRAM, PRAM, RRAM, and so on. The memory devices described herein may be part of a semiconductor device.

A pre-metal dielectric film (PMD) 110 is formed on the substrate 100 where the circuit pattern 105 is formed. For example, the pre-metal dielectric film 110 may include silicon oxide, silicon nitride, silicon oxynitride, flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

In the semiconductor device according to some exemplary embodiments, the eFuse structure 11 and the interconnect structure 12 may be formed on the pre-metal dielectric film 110. The eFuse structure 11 and the interconnect structure 12 may be formed within an interlayer insulating film 115 formed on the pre-metal dielectric film 110. For example, according to some exemplary embodiments, the semiconductor device may be formed in back end of line (BEOL) process.

The interlayer insulating layer 115 may include at least one of low-k material, oxide film, nitride film and oxynitride film, for example. The low-k material will not be redundantly described herein, as it may be similar to the description about the pre-metal dielectric film 110 provided above.

The eFuse structure 11 may include a first metal pattern 200, a second metal pattern 300, a third metal pattern 400, a first via 510 and a second via 520.

The first metal pattern 200 may be formed at a first vertical level on the substrate 100, the second metal pattern 300 may be formed at a second vertical level and between the first vertical level and the substrate 100, and the third metal pattern 400 may be formed at a third vertical level between the substrate 100 and the second vertical level. Accordingly, the eFuse structure included in the semiconductor device according to exemplary embodiments is a stacked metal eFuse structure.

For example, when the first metal pattern 200 is disposed at a first height from an upper surface of the substrate 100, and the second metal pattern 300 is disposed at a second height from the upper surface of the substrate 100, the first height is greater than the second height. For example, the height from the upper surface of the substrate 100 to the first metal pattern at which the first metal pattern 200 is formed, is greater than the height from the upper surface of the substrate 100 to the second vertical level where the second metal pattern 300 is formed.

The relationship between the second vertical level and a third vertical level may be similar to the relationship between the first vertical level and the second vertical level described above.

In a semiconductor device according to exemplary embodiments, positive voltage may be applied to the first metal pattern 200 of the eFuse structure 11, and negative voltage is applied to the third metal pattern 400. When a programming current is provided to the eFuse structure, the current flows in a direction from the first metal pattern 200 to the third metal pattern 400. Accordingly, electrons move in a direction from the third metal pattern 400 to the first metal pattern 200.

Figure 2:
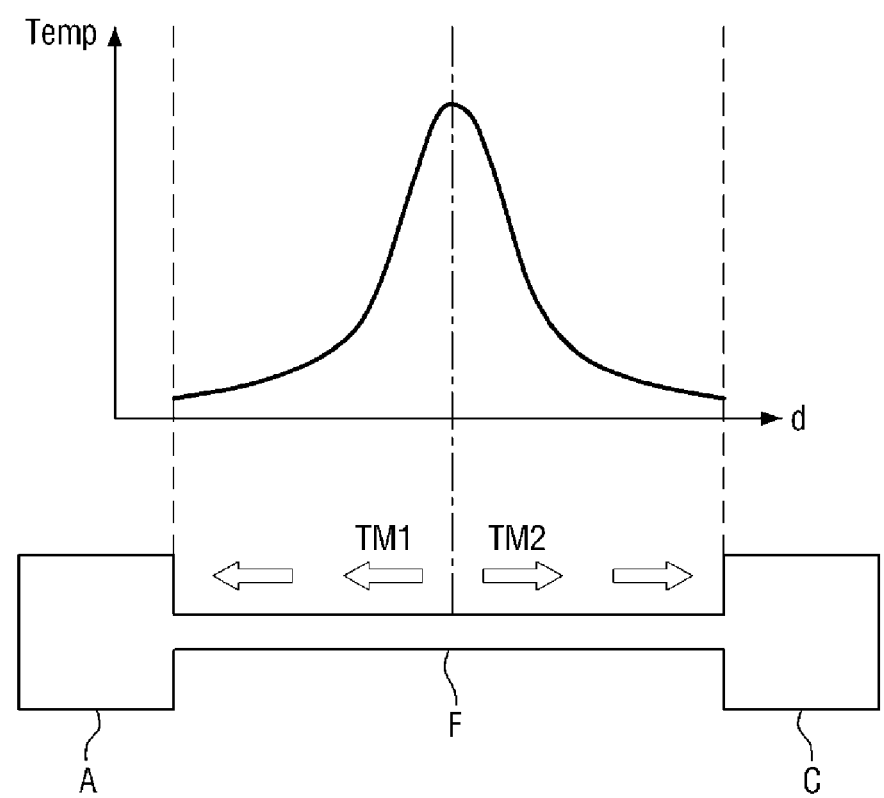
FIG. 2 is a diagram provided to explain an effect of thermomigration in a process of programming an eFuse structure included in a semiconductor device according to exemplary embodiments.

Referring to FIGS. 1 to 3, the first metal pattern 200 is connected to the anode A and the third metal pattern 400 is connected to the cathode C.

The first metal pattern 200 may include a first bent portion 210.

The first bent portion 210 includes a first portion 212 and a second portion 214 which extend in a direction Y1 and are most adjacent to each other. The first portion 212 of the first bent portion 210 and the second portion 214 of the first bent portion 210 may be formed in parallel with each other.

The expression "most adjacent" as used herein refers to a state in which no metal pattern is interposed between a first surface of the first portion 212 of the first bent portion 210 and a first, opposite surface of the second portion 214 of the first bent portion 210.

For example, only the interlayer insulating film 115 may be formed between the first portion 212 of the first bent portion 210 and the second portion 214 of the first bent portion 210 (e.g., between surfaces of the first portion 212 and second portion 214 that face each other). The first portion 212 of the first bent portion 210 and the second portion 214 of the first bent portion 210 are electrically connected.

The first bent portion 210 further includes a third portion 216 connecting the first portion 212 of the first bent portion 210 to the second portion 214 of the first bent portion 210. The third portion 216 of the first bent portion 210 may be formed so as to extend in a direction X1.

The third portion 216 of the first bent portion 210 connects the first portion 212 of the first bent portion 210 to the second portion 214 of the first bent portion 210, electrically and physically.

As illustrated in FIG. 4, the third portion 216 of the first bent portion 210 may connect a first end of the first portion 212 of the first bent portion 210 to a corresponding first end of the second portion 214 of the first bent portion 210, although exemplary embodiments are not limited thereto.

Hereinbelow, a semiconductor device according to exemplary embodiments will be explained by referring to an example in which the first portion 212 of the first bent portion 210, the third portion 216 of the first bent portion 210 and the second portion 214 of the first bent portion 210 connected in sequence form a "U" shape. For example, it is assumed herein that the first bent portion 210 is in a "U" shape.

A width of the first portion 212 of the first bent portion 210 is a first width W1, a width of the second portion 214 of the first bent portion 210 is a second width W2, and a width of the third portion 216 of the first bent portion 210 is a third width W3. The width W1 of the first portion 212 of the first bent portion 210 and the width W2 of the second portion 214 of the first bent portion 210 refer to widths in the direction X1, and the width W3 of the third portion 216 of the first bent portion 210 refers to a width in the direction Y1.

For example, the width W1 of the first portion 212 of the first bent portion may be equal to, or greater than the width W2 of the second portion 214 of the first bent portion. Further, in one embodiment, the width W3 of the third portion 216 of the first bent portion is greater than the width W1 of the first portion 212 of the first bent portion and than the width W2 of the second portion 214 of the first bent portion.

As the first metal pattern 200 includes the first bent portion 210 which is bent, the Joule's heating can be greater at the first bent portion 210 than at the linear structure. Additionally, by including the first bent portion 210, the first metal pattern 200 can increase the heat integration in the eFuse structure 11.

The first metal pattern 200 may additionally include a first auxiliary pattern 230. The first auxiliary pattern 230 may be formed so as to extend in the direction Y1. The first auxiliary pattern 230 is formed adjacent to the first bent portion 210, i.e., adjacent to the first portion 212 of the first bent portion 210.

The first auxiliary pattern 230 is opposite to the second portion 214 of the first bent portion 210, with the first portion 212 of the first bent portion 210 being interposed therebetween. For example, the first portion 212 of the first bent portion 210 is located between the first auxiliary pattern 230 and the second portion 214 of the first bent portion 210.

As illustrated in FIG. 4, the first auxiliary pattern 230 may be electrically connected with the first bent portion 210, although exemplary embodiments are not limited thereto. As illustrated, the first bent portion 210 and the first auxiliary pattern 230 may be connected with each other, but the first auxiliary pattern 230 is not used as a path for the current to flow, when the programming current is provided to the eFuse structure.

For example, the first auxiliary pattern 230 may increase the heat integration inside the eFuse structure, because the Joule's heat generated from the first bent portion 210 and so on rapidly dissipates around the eFuse structure, thus preventing temperature drop of the first bent portion 210 and the like.

The first metal pattern 200 may additionally include an extension pattern 245. The extension pattern 245 may connect the first bent portion 210 to the first auxiliary pattern 230. The extension pattern 245 may be formed so as to extend in the direction X1.

As illustrated in FIG. 4, the extension pattern 245 may connect a first end of the second portion 214 of the first bent portion 210 to a first end of the first auxiliary pattern 230, although exemplary embodiments are not limited thereto. A second end of the second portion 214 of the first bent portion 210 may be connected to the third portion 216 of the first bent portion 210, and the first end of the second portion 214 of the first bent portion 210 may be connected to the extension pattern 245.

In describing the eFuse structure 11 included in the semiconductor device according to exemplary embodiments, it is assumed that the second portion 214 of the first bent portion 210, the extension pattern 245, and the first auxiliary pattern 230 connected in sequence form a "U" shape.

Referring to FIGS. 4 and 5, the first bent portion 210, and the extension pattern 245 and the first auxiliary pattern 230 connected in sequence to the first bent portion 210 may form a spiral shape. For example, the second portion 214 of the first bent portion 210, the first portion 212 of the first bent portion 210 and the first auxiliary pattern 230 are formed in parallel with each other, while extending in the direction Y1. Because the first portion 212 of the first bent portion 210 and the second portion 214 of the first bent portion 210 are formed most adjacent to each other, a distance between the first portion 212 of the first bent portion 210 and the second portion 214 of the first bent portion 210 may be smaller than a distance between the second portion 214 of the first bent portion 210 and the first auxiliary pattern 230.

The first metal pattern 200 may additionally include a first power connection part 240. The first power connection part 240 is connected to the anode A of FIGS. 1 to 3. Referring to FIG. 4, the first power connection part 240 is connected to the extension pattern 245, and connected to the second portion 214 of the first bent portion via the extension pattern 245. The first power connection part 240 may be formed by extending from the extension pattern 245 in the direction Y1, but not limited thereto.

The first power connection part 240 may be opposed to the first bent portion 210 with the extension pattern 245 being interposed therebetween. For example, one end of the first portion 212 of the first bent portion 210, which is not connected with the third portion 216 of the first bent portion 210, is opposed to the first power connection part 240 with the extension pattern 245 being interposed therebetween.

As illustrated in FIG. 4, the first metal pattern 200 may additionally include the first power connection part 240, although exemplary embodiments are not limited thereto. For example, when the extension pattern 245 extends in the direction Y1 farther than shown in FIG. 4, the extension pattern 245 may be connected to the anode A of FIGS. 1 to 3, without the first power connection part 240.

Referring to FIG. 4, one end of the first auxiliary pattern 230 is connected with the first power connection part 240, but the other end of the first auxiliary pattern 230 is open. For example, while the first auxiliary pattern 230 is formed by being branched off from the extension pattern 245, the distal end of the first auxiliary pattern 230 is open.

Therefore, current does not flow through the first auxiliary pattern 230, even when the positive voltage is applied to the first power connection part 240 to provide the programming current to the eFuse structure 11. For example, the first auxiliary pattern 230 is not used as a current path.

The first metal pattern 200 may be formed of, for example, one of tungsten (W), aluminum (Al), copper (Cu) and a copper alloy. The copper alloy herein may include, in the copper, C, Ag, Co, Ta, In, Sn, Zn, Mn, Ti, Mg, Cr, Ge, Sr, Pt, Mg, Al or Zr.

Between the first metal pattern 200 and the interlayer insulating film 115, a barrier film may be additionally formed so as to prevent the constituent metal materials of the first metal pattern 200 from being diffused to the vicinity of the interlayer insulating film 115. For example, the barrier film may include one of Ta, TaN, TaSiN, Ti, TiN, TiSiN, W, WN and a combination thereof.

The second metal pattern 300 may be formed so as to extend in the direction X1, for example.

The third metal pattern 400 may include a plate portion 405 and a second power connection part 440.

Unlike the first metal pattern 200 that includes a bent portion, the third metal pattern 400 may include the plate portion 405 which is in a rectangular shape.

The second power connection part 440 of the third metal pattern 400 is connected to the cathode C of FIGS. 1 to 3. The second power connection part 440 may be formed so as to be connected to the plate portion 405.

Unlike the illustration, the third metal pattern 400 may not include the second power connection part 440. In that case, the cathode C of FIGS. 1 to 3 may be connected to a portion of the plate portion 405.

The second metal pattern 300 and the third metal pattern 400 may each be formed of, for example, one of tungsten (W), aluminum (Al), copper (Cu) and a copper alloy. The copper alloy herein may include, in the copper, C, Ag, Co, Ta, In, Sn, Zn, Mn, Ti, Mg, Cr, Ge, Sr, Pt, Mg, Al or Zr.

Further, the second metal pattern 300 and the third metal pattern 400 may additionally include a barrier film to prevent the second metal pattern 300 and the third metal pattern 400 from being diffused to the interlayer insulating film 115.

Unlike the illustration in FIG. 4, the second metal pattern 300 may be formed so as to extend in the direction Y1 by adjusting locational relationships of the first metal pattern 200 and the third metal pattern 400, and so on.

A first via 510 is formed between the first metal pattern 200 and the second metal pattern 300. The first via 510 may connect the first metal pattern 200 to the second metal pattern 300 electrically and physically.

Specifically, the first via 510 connects the first portion 212 of the first bent portion 210 of the first metal pattern 200, and the second metal pattern 300.

Numerous metal wires, excluding the eFuse structure 11, are formed at the first vertical level where the first metal pattern 200 is formed and at the second vertical level where the second metal pattern 300 is formed.

In general, if a via contact size has a minimum size according to a minimum design rule, the resistance of the via contact will be increased. Thus, the Joule's heat generated at the via contact may also increase. Accordingly, a typical eFuse structure may end up being programmed at locations of a first metal pattern which are not intended by a semiconductor device designer. In example embodiments, the size of the first via 510 may have a size greater than the minimum size.

Meanwhile, the width W1 of the first via 510 in the direction X1 may be subject to influence of the width in the direction X1 of the first metal pattern 200 which is connected to the first via 510. Accordingly, in order to decrease the resistance of the first via 510, the width W4 in the direction Y1 of the first via 510 may be increased more than the width W1 in the direction X1 of the first via 510.

As a result, the width W4 in the direction Y1 of the first via 510 may be greater than the width W1 in the direction X1 of the first via 510.

The second via 520 is formed between the second metal pattern 300 and the third metal pattern 400. The second via 520 may connect the second metal pattern 300 to the third metal pattern 400 electrically and physically.

Specifically, the second via 520 connects the plate portion 405 of the third metal pattern 400, and the second metal pattern 300.

For example, the width W5 in the direction X1 of the second via 520 may be greater than the width W1 in the direction X1 of the first via 510.

Because the second metal pattern 300 is formed so as to extend in the direction X1, the first via 510 and the second via 520 connected to the second metal pattern 300 are aligned along the direction X1.

A distance between the first via 510 and the second via 520 connected to the second metal pattern 300 may be less than the Blech length. The "Blech length" as used herein refers to a lower limit for the electromigration phenomenon to occur.

When the distance between the first via 510 and the second via 520 connected to the second metal pattern 300 is less than the Blech length, electromigration does not occur between the first via 510 and the second via 520. For example, the second metal pattern 300 does not have voids or hill-locks generated by the electromigration.

The first via 510 and the second via 520 may be formed of one of tungsten (W), aluminum (Al), copper (Cu) and a copper alloy. The copper alloy herein may include, in the copper, C, Ag, Co, Ta, In, Sn, Zn, Mn, Ti, Mg, Cr, Ge, Sr, Pt, Mg, Al or Zr.

Between the first via 510 and the interlayer insulating film 115, and/or between the second via 520 and the interlayer insulating film 115, a barrier film may be additionally formed so as to prevent the constituent metal materials of the first via 510 and the second via 520 from being diffused to the vicinity of the interlayer insulating film 115.

The interconnect structure 12 may include a first to a third wires 610, 620, 630 adjacent to one another.

The first to the third wires 610, 620, 630 may be formed at the same vertical level. For example, the first to the third wires 610, 620, 630 may be disposed at the same height from the substrate 100. For example, each of the first to the third wires 610, 620, 630 may be used as a power supply line, a ground line, a signal line (e.g., for an address, a command, a control signal, etc.), or a data line (e.g., for read data or write data) in the semiconductor device. In general, when each of the first to the third wires 610, 620, 630 is used as the signal line or the data line a width of each of the first to the third wires 610, 620, 630 and a distance between the first wire 610 and the second wire 620 or a distance between the second wire 620 and the third wire 630 may be a minimum size according to the minimum design rule for manufacturing the semiconductor device. As illustrated in FIG. 5, the first to the third wires 610, 620, 630 included in the interconnect structure 12 may be formed at the first vertical level where the first metal pattern 200 is formed, but this is provided only for convenience of explanation and exemplary embodiments are not limited thereto.

The first to the third wires 610, 620, 630 may be formed so as to extend in a direction Y2, respectively. Further, the first wire 610, the second wire 620 and the third wire 630 may be aligned in sequence in a direction X2. The direction X2 may be the same as the direction X1, and the direction Y2 may be the same as the direction Y1.

Further, a third via 530 is formed between the third wire 630 and a metal pattern 301 formed at the same vertical level as the second metal pattern 300. For example, the third via 530 may connect the third wire 630 to the metal pattern 301 electrically and physically. A size of the third via 530 may have the minimum size according to a minimum design rule for manufacturing the semiconductor device. In certain embodiments, a width W7 in the direction X2 of the third via 530 may be smaller than the width W1 in the direction X1 of the first via 510.

The first to the third wires 610, 620, 630 may be formed of one of tungsten (W), aluminum (Al), copper (Cu) and a copper alloy. The copper alloy herein may include, in the copper, C, Ag, Co, Ta, In, Sn, Zn, Mn, Ti, Mg, Cr, Ge, Sr, Pt, Mg, Al or Zr.

Between the first to the third wires 610, 620, 630 and the interlayer insulating film 115, a barrier film may be additionally formed so as to prevent the constituent metal materials of the first to the third wires 610, 620, 630 from being diffused to the vicinity of the interlayer insulating film 115.

Referring to FIGS. 4 and 5, in the eFuse structure 11, the first portion 212 and the second portion 214 of the first bent portion 210 may be spaced apart from each other by a first space S1. In the interconnect structure 12, the distance between the first wire 610 and the second wire 620 spaced apart from each other may be a second space S2.

For example, the sum P of the space S1 between the first portion 212 of the first bent portion 210 and the second portion 214 of the first bent portion 210, and the width W2 in the direction X1 of the second portion 214 of the first bent portion 210, may be substantially identical to the sum P of the space S2 between the first wire 610 and the second wire 620 and the width W6 in the direction X2 of the first wire 610.

When it is assumed that the first wire 610 extends in the direction Y1, then the width W6 in the direction X2 of the first wire 610 corresponds to the width in the direction X1.

In example embodiments, the space S1 between the first portion 212 of the first bent portion 210 and the second portion 214 of the first bent portion 210 is different from the space S2 between the first wire 610 and the second wire 620. For example, the space S1 between the first portion 212 of the first bent portion 210 and the second portion 214 of the first bent portion 210 may be greater than the space S2 between the first wire 610 and the second wire 620.

For example, the width W2 in the direction X1 of the second portion 214 of the first bent portion 212 may be smaller than the width W6 in the direction X2 of the first wire 610.

In a mask pattern to form the eFuse structure 11 and a mask pattern to form the interconnect structure 12, the second portion 214 of the first bent portion 210 and the first wire 610 may be defined with the same width, for example, defined with a minimum linewidth that can be formed by photolithography.

For example, in forming the semiconductor device, the width W2 in the direction X1 of the second portion 214 of the first bent portion 210 may be smaller than the width W6 in the direction X2 of the first wire 610. This will be described below.

The relationship between the first portion 212 of the first bent portion 210 and the first auxiliary pattern 230, and the second wire 620 and the third wire 630 may be similar to that described above.

In example embodiments, the space S1 between the first portion 212 of the first bent portion 210 and the second portion 214 of the first bent portion 210 may be greater than the width W2 of the second portion 214 of the first bent portion 210 in the direction X1. For example, the space S1 between the first portion 212 and the second portion 214 of the first bent portion 210 may be greater than the width W2 of the second portion 214 of the first bent portion 210, and smaller than five times the width W2 of the second portion 214 of the first bent portion 210.

For example, it is assumed herein that, by design, the second portion 214 of the first bent portion of the first metal pattern 200 is cut to program the eFuse structure 11. When the first portion 212 and the second portion 214 of the first bent portion 210 are at a small distance to each other, the eFuse structure 11 may not be programmed even when the second portion 214 of the first bent portion is severed. Because of the small distance between the first portion 212 and the second portion 214 of the first bent portion 210, a bridge may be generated between the severed second portion 214 and the first portion 212 of the first bent portion 210.

Accordingly, the distance between the first portion 212 and the second portion 214 of the first bent portion 210 may be increased with respect to the width W1 to ensure that the eFuse structure 11 is stably programmed.

In a manufacturing the semiconductor device, when the first space S1 between the first portion 212 and the second portion 214 of the first bent portion 210 is increased, a conditional bias may be applied according to the first distance design during a photolithography process, thus causing the widths of the first portion 212 and the second portion 214 of the first bent portion 210 to be adjusted. Additionally, by the application of the conditional bias, a distance between the first portion 212 and the second portion 214 of the first bent portion 210 is adjusted accordingly. For example, when the first space S1 between the first portion 212 and the second portion 214 of the first bent portion 210 is increased, the actual width W1 of the first portion 212 and the actual width W2 of the second portion 214, and the actual space S1 may be adjusted by an optical proximity correction (OPC).

In a manufacturing the semiconductor device, when the first distance S1 increases, the conditional bias is applied during a photolithography process, thus increasing the actual width more than the designed width of the first portion 212 and the second portion 214 of the first bent portion 210.

During the photolithography process, when the actual width W2 of the second portion 214 of the first bent portion 210 is increased more than the designed width of the second portion 214 of the first bent portion 210 due to application of the conditional bias, this may deteriorate the programming characteristic of the eFuse structure 11.

Accordingly, during the photolithography process of transferring the eFuse structure 11 onto a photosensitive film, the conditional bias applied according to the designed first distance is not applied. By doing so, width adjustment of the first portion 212 and the second portion 214 of the first bent portion 210 may be prevented.

In example embodiments, the conditional bias may not be applied by, for example, putting a mark when a photo mask for the eFuse structure is generated.

On the contrary, during the photolithography process of transferring the interconnect structure 12 onto a photosensitive film, the conditional bias is allowed to be applied according to the second distance design between the first wire 610 and the second wire 620.

For example, when the designed second distance increases, the conditional bias is applied during the photolithography process, thus increasing the actual width more than the designed width of the first wire 610 and the second wire 620. On the contrary, during the photolithography process, the application of the conditional bias causes a distance between the first wire 610 and the second wire 620 to decrease.

For example, the sum P of the space S1 between the first portion 212 and the second portion 214 of the first bent portion 210, and the width W2 in the direction X1 of the second portion 214 of the first bent portion 210, may be substantially identical to the sum P of the space S2 between the first wire 610 and the second wire 620 and the width W6 in the direction X2 of the first wire 610, but the width W2 in the direction X1 of the second portion 214 of the first bent portion 210 may be smaller than the width W6 in the direction X2 of the first wire 610.

Figure 6:
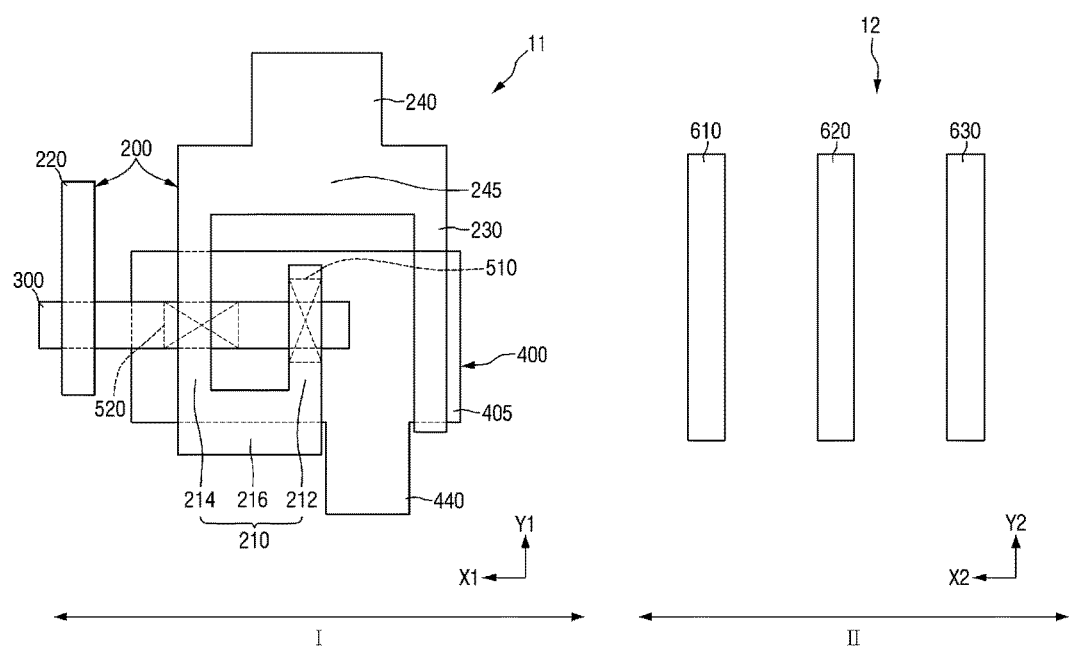
FIG. 6 is a top view provided to explain a semiconductor device according to some exemplary embodiments.

FIG. 6 is a top view provided to explain a semiconductor device according to some exemplary embodiments. For convenience of explanation, differences from the exemplary embodiments explained above with reference to FIGS. 4 to 5 will be mainly explained below.

Referring to FIG. 6, in a semiconductor device according to some exemplary embodiments, the eFuse structure 11 may additionally include a second auxiliary pattern 220.

The second auxiliary pattern 220 may be included in the first metal pattern 200. Accordingly, the second auxiliary pattern 220 may be formed at the first vertical level.

The second auxiliary pattern 220 may be formed so as to extend in the direction Y1. The second auxiliary pattern 220 is formed adjacent to the first bent portion 210, i.e., adjacent to the second portion 214 of the first bent portion 210. The second auxiliary pattern 220 is opposed to the first portion 212 of the first bent portion 210, with the second portion 214 of the first bent portion 210 being interposed therebetween. For example, the second portion 214 of the first bent portion 210 is located between the second auxiliary pattern 220 and the first portion 212 of the first bent portion 210.

As illustrated in FIG. 6, the second auxiliary pattern 220 may extend in the direction Y1 and formed abreast of the second portion 214 of the first bent portion 210, although exemplary embodiments are not limited thereto.

The second auxiliary pattern 220, the second portion 214 and the first portion 212 of the first bent portion 210, and the first auxiliary pattern 230 may extend in the direction Y1 and formed adjacent to one another in a sequential order.

The second auxiliary pattern 220 is spaced apart from the first bent portion 210, and thus electrically isolated from the first bent portion 210. Accordingly, when the programming current is provided to the eFuse structure, the second auxiliary pattern 220 is not used as a path for the current to flow.

The second auxiliary pattern 220 may prevent crack-spreading to the vicinity of the eFuse structure 11 when the eFuse structure is programmed 11. Further, the second auxiliary pattern 220 assists integration of the heat generated inside the eFuse structure 11, by preventing rapid diffusion of the Joule's heat generated from the first bent portion 210 or the like, to the vicinity of the eFuse structure 11.

The space between the second portion 214 of the first bent portion 210 and the second auxiliary pattern 220 may be greater than the width in the direction X1 of the second portion 214 of the first bent portion 210. In detail, the space between the second portion 214 of the first bent portion 210 and the second auxiliary pattern 220 may be greater than the width of the second portion 214 of the first bent portion 210 and smaller than five times the width of the second portion 214 of the first bent portion 210.

Figure 7:
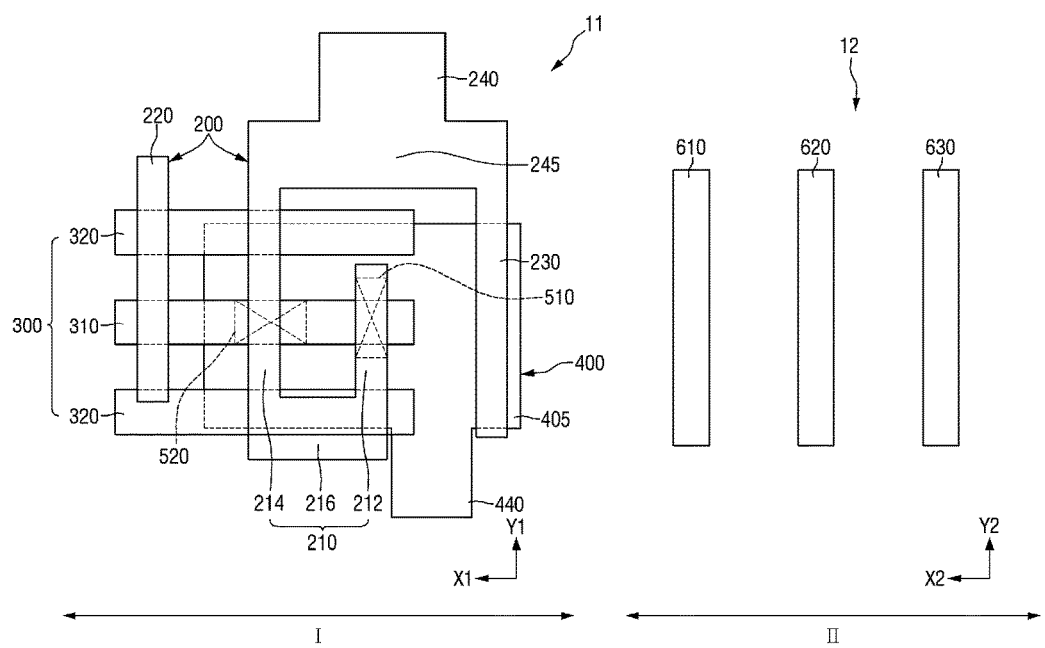
FIG. 7 is a top view provided to explain a semiconductor device according to some exemplary embodiments.

FIG. 7 is a top view provided to explain a semiconductor device according to some exemplary embodiments. For convenience of explanation, differences that are not explained above with reference to FIG. 6 will be mainly explained below.

Referring to FIG. 7, in a semiconductor device according to some exemplary embodiments, the second metal pattern 300 may include a connecting pattern 310 and a third auxiliary pattern 320.

The connecting pattern 310 is formed so as to extend in the direction X1. The third auxiliary pattern 320 may be formed on both sides of the connecting pattern 310. The third auxiliary pattern 320 may extend in the direction X1 and may be formed abreast of the connecting pattern 310.

The first via 510 and the second via 520 are connected to the connecting pattern 310. For example, the connecting pattern 310 is electrically connected to the first bent portion 210 of the first metal pattern 200 and the plate portion 405 of the third metal pattern 400.

The third auxiliary pattern 320 plays a role of reducing the width of the connecting pattern 310 located between the third auxiliary pattern 320. For example, the third auxiliary pattern 320 formed on both sides of the connecting pattern 310 prevents the width of the connecting pattern 310 from increasing.

Further, the third auxiliary pattern 320 may increase the heat integration inside the eFuse structure 11, because the Joule's heat generated from the connecting pattern 310 and so on rapidly dissipates around the eFuse structure 11, thus preventing temperature drop of the connecting pattern 310 and the like.

Figure 8:
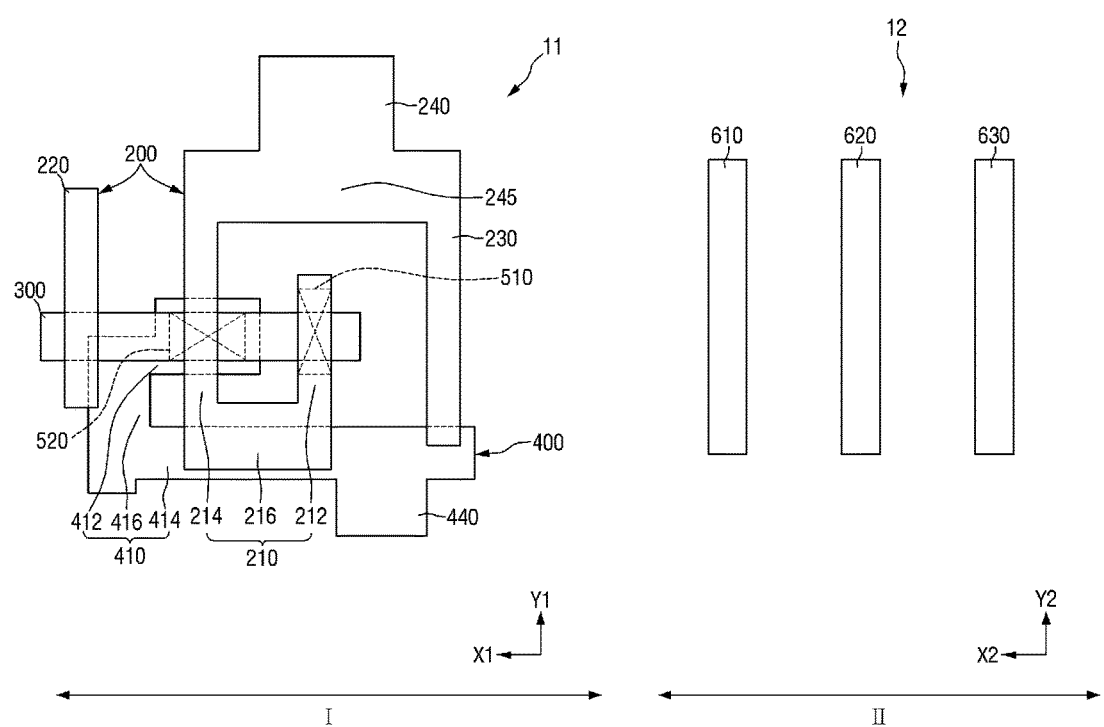
FIG. 8 is a top view provided to explain a semiconductor device according to some exemplary embodiments.

FIG. 8 is a top view provided to explain a semiconductor device according to some exemplary embodiments. For convenience of explanation, differences that are not explained above with reference to FIG. 6 will be mainly explained below.

Referring to FIG. 8, in a semiconductor device according to some exemplary embodiments, the third metal pattern 400 may include a second bent portion 410.

The second bent portion 410 includes a first portion 412 and a second portion 414 adjacently opposed to each other. The second portion 414 of the second bent portion 410 may be formed so as to extend in the direction X1.

Further, the second bent portion 410 includes a third portion 416 connecting the first portion 412 of the second bent portion 410 to the second portion 414 of the second bent portion 410. The third portion 416 of the second bent portion 410 may be formed so as to extend in the direction Y1.

As illustrated in FIG. 8, the third portion 416 of the second bent portion 410 may connect one end of the first portion 412 of the second bent portion 410 with opposed one end of the second portion 414 of the second bent portion 410, although exemplary embodiments are not limited thereto.

In example embodiments, the second bent portion 410, which is bent, the third metal pattern 400 can increase the heat integration in the eFuse structure 11.

The second power connection part 440 may be formed by extending from the second portion 414 of the second bent portion 410 in the direction Y1, but not limited thereto.

The second power connection part 440 of the third metal pattern 400 is connected to the cathode C of FIGS. 1 to 3. The second power connection part 440 may be formed so as to be connected to the second portion 414.

The second via 520 may connect the second metal pattern 300 to the second bent portion 410, or more specifically, may connect the second metal pattern 300 to the first portion 412 of the second bent portion 410.

Figure 9:
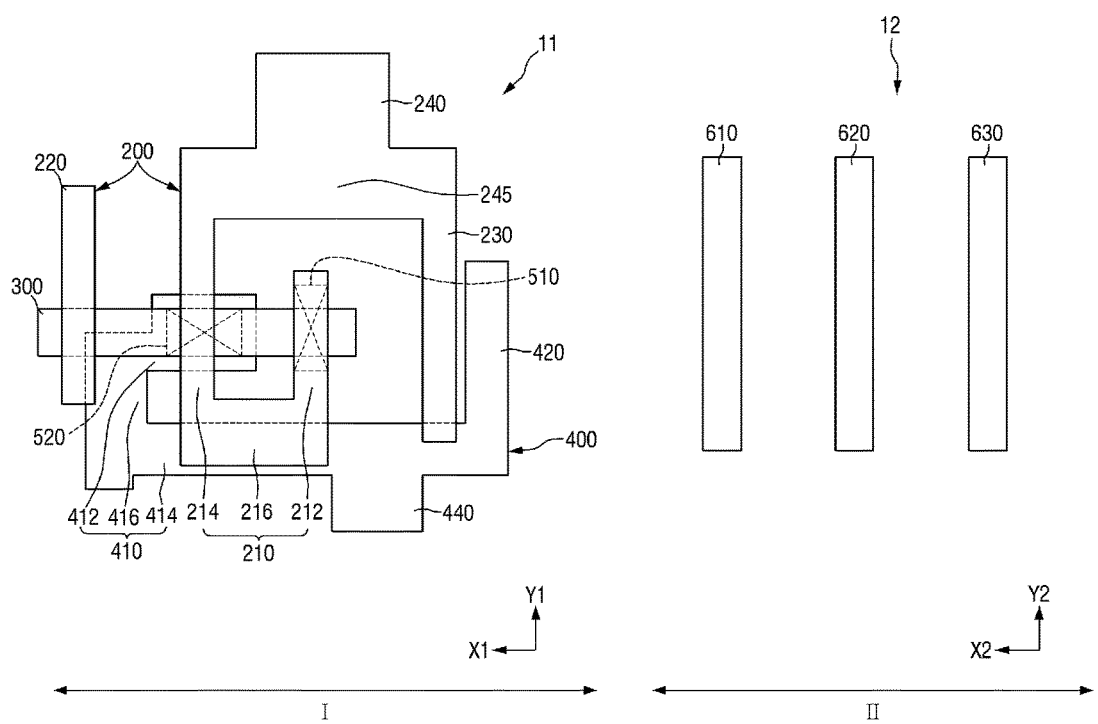
FIG. 9 is a top view provided to explain a semiconductor device according to some exemplary embodiments.
Figure 10:
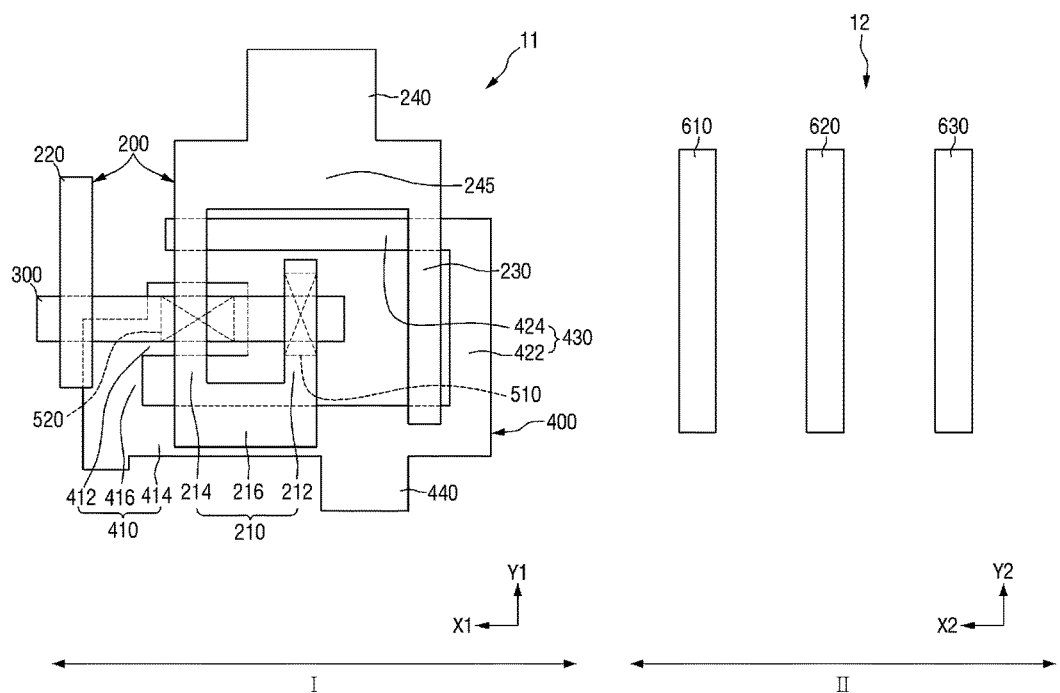
FIG. 10 is a top view provided to explain a semiconductor device according to some exemplary embodiments.

FIG. 9 is a top view provided to explain a semiconductor device according to some exemplary embodiments. FIG. 10 is a top view provided to explain a semiconductor device according to some exemplary embodiments. For convenience of explanation, differences that are not explained above with reference to FIG. 8 will be mainly explained below.

Referring to FIG. 9, in an eFuse structure of a semiconductor device according to some exemplary embodiments, the third metal pattern 400 may additionally include a fourth auxiliary pattern 420.

The fourth auxiliary pattern 420 is formed so as to extend in the direction Y1. The fourth auxiliary pattern 420 is opposed to the third portion 416 of the second bent portion 410, with the first portion 412 of the second bent portion 410 and the second portion 414 of the second bent portion 410 being interposed therebetween.

One end of the second portion 414 of the second bent portion 410, which is connected to the third portion 416 of the second bent portion 410, and the opposed other end of the second portion 414 of the second bent portion 410 may be connected to the fourth auxiliary pattern 420.

As illustrated, the second bent portion 410 and the fourth auxiliary pattern 420 may be connected to each other, but the fourth auxiliary pattern 420 is not used as a path for the current to flow, when the programming current is provided to the eFuse structure 11.

The fourth auxiliary pattern 420 may increase the heat integration inside the eFuse structure 11, by preventing rapid dissipation of the Joule's heat generated from the first bent portion 410 and so on to the vicinity of the eFuse structure 11.

Referring to FIG. 10, in an eFuse structure of a semiconductor device according to some exemplary embodiments, the third metal pattern 400 may additionally include a fifth auxiliary pattern 430 including a first portion 422 and a second portion 424.

The first portion 422 of the fifth auxiliary pattern 430 is formed so as to extend in the direction Y1. The second portion 424 of the fifth auxiliary pattern 430 is formed so as to extend in the direction X1.

The first portion 422 of the fifth auxiliary pattern 430 is opposed to the third portion 416 of the second bent portion 410, with the first portion 412 and the second portion 414 of the second bent portion 410 being interposed therebetween. The second portion 424 of the fifth auxiliary pattern 430 is formed abreast of the second portion 414 of the second bent portion 410, with the first portion 412 of the second bent portion 410 being interposed therebetween.

The first portion 422 of the fifth auxiliary pattern 430 may be connected to the second bent portion 410, or more specifically, connected to the second portion 414 of the second bent portion 410 and the second portion 424 of the fifth auxiliary pattern 430. The fifth auxiliary pattern 430 may be formed in a "L" shape, having the first portion 422 of the fifth auxiliary pattern 430 connected to the second portion 424 of the fifth auxiliary pattern 430, although exemplary embodiments are not limited thereto.

Although the fifth auxiliary pattern 430 may be connected to the second power connection part 440, because one end of the second portion 424 of the fifth auxiliary pattern 430 is open, the fifth auxiliary pattern 430 is not used as a path for the current to flow when the programming current is provided to the eFuse structure 11.

Figure 11:
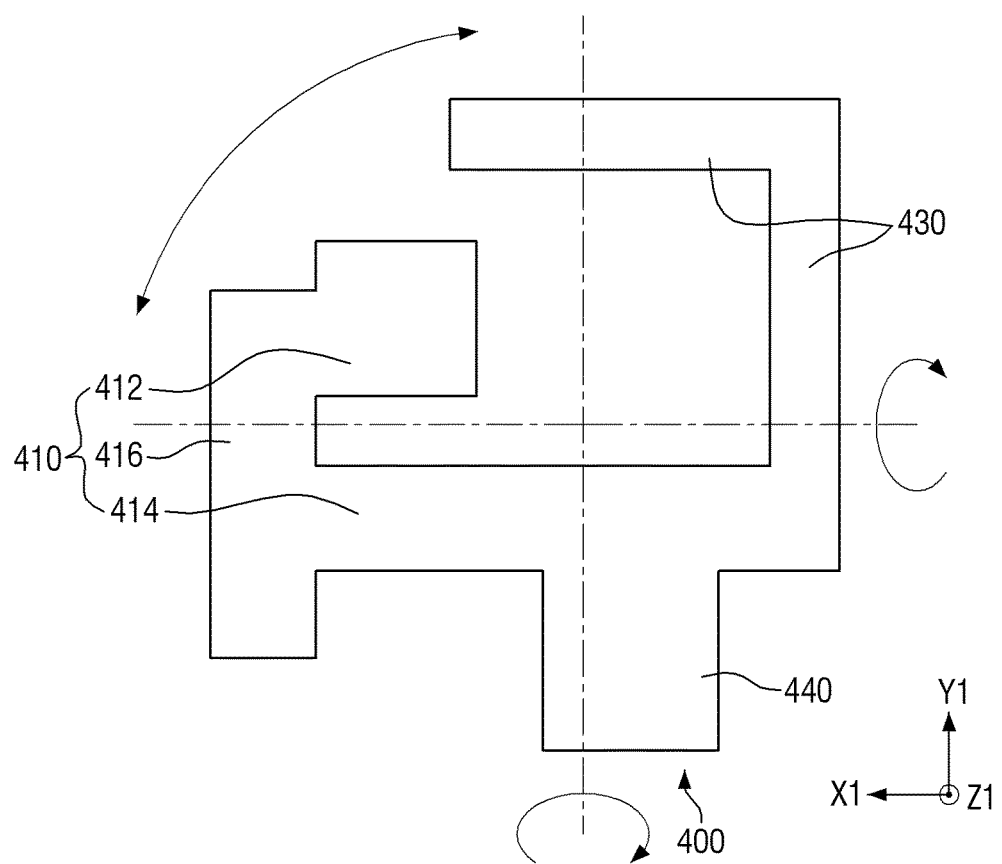
FIG. 11 is a diagram provided to explain a modified example of exemplary embodiments.

FIG. 11 is a diagram provided to explain a modified example of exemplary embodiments. For reference, FIG. 11 may be an illustration provided to explain a modified example of the embodiment described by use of FIG. 10.

Referring to FIG. 11, in a semiconductor device according to exemplary embodiments, the third metal pattern 400 included in the eFuse structure 11 may be rotated about a direction X1 axis, a direction Y1 axis, and a direction Z1 axis, respectively.

For example, the third metal pattern 400 may be rotated about the direction Y1 axis by 180 degrees. The third metal pattern 400 may be rotated about the direction X1 axis by 180 degrees.

Additionally, the third metal pattern 400 may be rotated about the direction Z1 axis in a clockwise or counterclockwise direction by 90 or 180 degrees.

Figure 12:
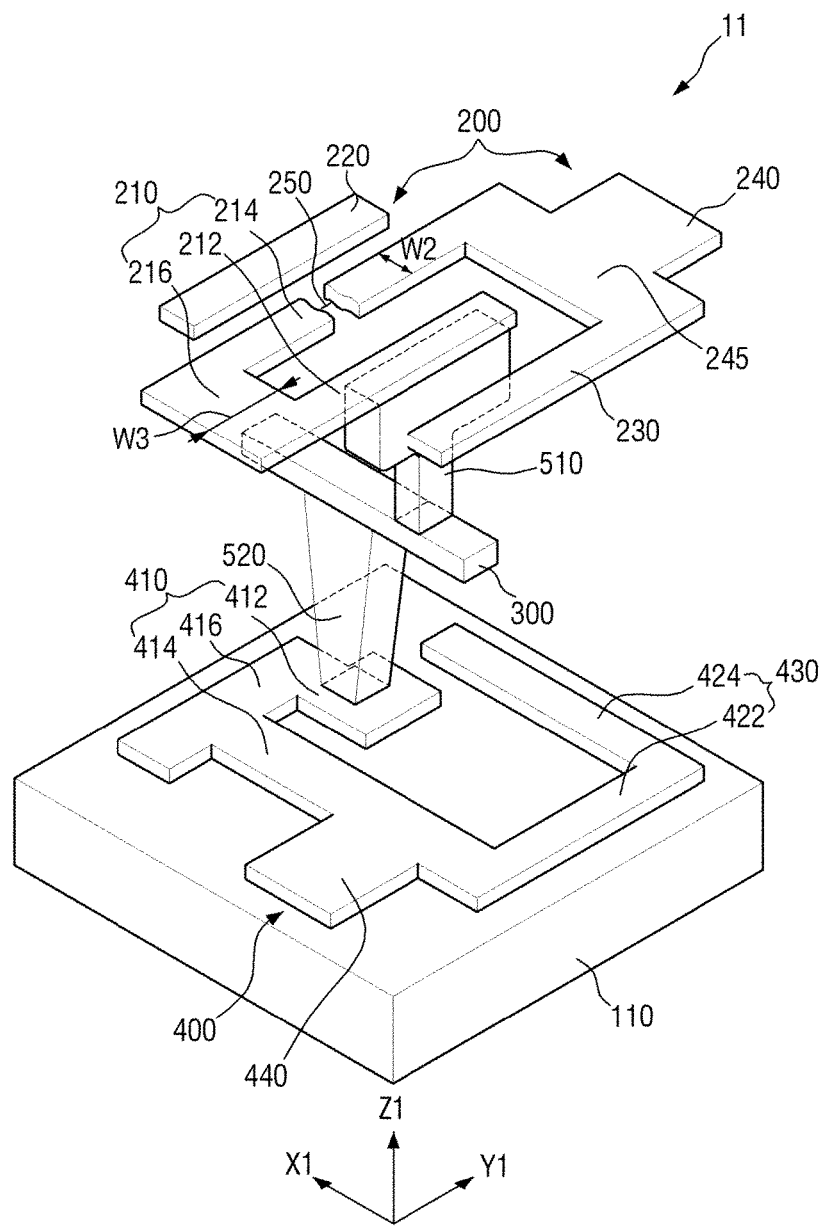
FIG. 12 is a diagram provided to explain formation of a void when a programming current is provided to an eFuse structure according to exemplary embodiments.

FIG. 12 is a diagram provided to explain formation of a void (e.g., open area) when a programming current is provided to an eFuse structure 11 according to exemplary embodiments. For convenience of explanation, it is assumed that a programming current is provided to the eFuse structure 11 included in the semiconductor device described above with reference to FIG. 10.

Providing a programming current to the eFuse structure 11 involves applying a positive voltage to the first power connection part 240 and applying a negative voltage to the second power connection part 440.

When the programming current is provided to the eFuse structure 11 included in the semiconductor device according to exemplary embodiments, the second portion 214 of the first bent portion 210 may have the narrowest width W2 among areas of the first bent portion 210, in which case the second portion 214 of the first bent portion 210 may have the highest current density.

For example, driving force by electromigration can be maximized at the second portion 214 of the first bent portion 210. Further, because the width W3 of the third portion 216 of the first bent portion 210, which is connected to the second portion 214 of the first bent portion 210, is greater than the width W2 of the second portion 214 of the first bent portion 210, the current crowding at the second portion 214 of the first bent portion 210 can be aggravated.

Additionally, when the programming current is provided to the eFuse structure 11 included in the semiconductor device according to exemplary embodiments, the first via 510 may be the location of maximum temperature among the areas of the eFuse structure.

Referring to FIGS. 1 to 3, when the programming current is provided to the eFuse structure, because the programmed location of the eFuse structure 11 may be generated between the site of maximum temperature and the anode A, the programmed location may be generated at the first bent portion 210. Further, the programmed location may be in the vicinity of the location having the greatest temperature change (i.e., the location having the highest differential value of temperature distribution) in the eFuse structure, rather than the location having the maximum temperature in the eFuse structure. This is because the driving force by thermomigration reaches a maximum at a location of the eFuse structure 11 having the greatest temperature change.

Accordingly, the driving force by thermomigration may be a maximum at the second portion 214 and the third portion 216 of the first bent portion 210, rather than the first portion 212 of the first bent portion 210 which is connected to the first via 510 having the maximum temperature.

The sum of the driving force by electromigration and the driving force by thermomigration is the net driving force exerted into the eFuse structure 11. Therefore, in view of the net driving force, the net driving force exerted into the eFuse structure 11 may reach maximum at the second portion 214 of the first bent portion 210. For example, when the programming current is provided to the eFuse structure 11, a void 250 may be formed at the second portion 214 of the first bent portion 210, resulting the eFuse structure 11 being programmed.

Figure 13:
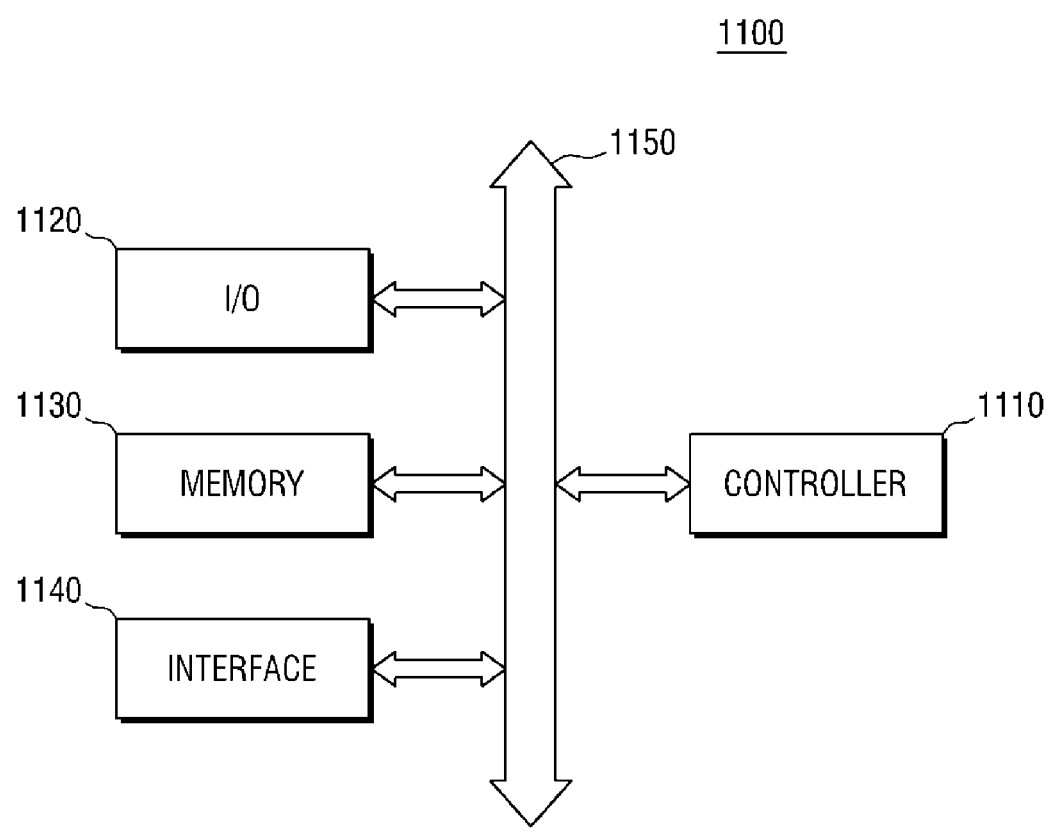
FIG. 13 is a schematic block diagram of a memory system comprising a semiconductor device according to exemplary embodiments.

FIG. 13 is a schematic block diagram of a memory system comprising a semiconductor device according to exemplary embodiments.

Referring to FIG. 13, the memory system 1100 is applicable to a personal digital assistant (PDA), a portable computer, a web tablet, a wireless phone, a mobile phone, a digital music player, a memory card, or all devices that are capable of transmitting and/or receiving data in wireless environment.

The memory system 1100 includes a controller 1110, an input/output device 1120 such as a keypad, a keyboard, and a display, a memory 1130, an interface 1140, and a bus 1150. The memory 1130 and the interface 1140 are communicated with each other via the bus 1150.

The controller 1110 includes at least one micro processor, digital signal processor, micro controller or other similar processors. The memory 1130 may be used for storing commands executed by the controller. The input/output device 1120 may receive an external data or signal inputted to the system 1100, or output data or signal outside the system 1100. For example, the I/O device 1120 may include a keyboard, a keypad, or a display device.

The memory 1130 may include a non-volatile memory device. The memory 1130 may additionally include a different type of memory, a volatile memory allowing arbitrary random access, or other different types of memory. The memory 1130 may include the eFuse structure 11 disclosed herein.

The interface 1140 operates to send out data to a communication network or to receive the data from the network.

In concluding the detailed description, those skilled in the art will appreciate that many variations and modifications can be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device, comprising:
a substrate including a first region and a second region;
an eFuse structure formed in the first region; and
an interconnect structure formed in the second region,
wherein:
the eFuse structure includes a first metal pattern formed at a first vertical level on the substrate, a second metal pattern formed at a second vertical level between the first vertical level and the substrate, a third metal pattern formed at a third vertical level between the second vertical level and the substrate, a first via physically connecting the first metal pattern to the second metal pattern, and a second via physically connecting the second metal pattern to the third metal pattern,
the first metal pattern includes a first bent portion in a U shape, and a first auxiliary pattern extending in a first direction and being adjacent to and electrically isolated from the first bent portion,
the first bent portion includes a first portion which extends in the first direction and is electrically connected to the first via, and a second portion extending in the first direction and being adjacent to the first portion,
the second portion is disposed between the first portion and the first auxiliary pattern, and
a first distance between the first portion and the second portion spaced apart from the first portion is greater than a width of the second portion in a second direction perpendicular to the first direction.

2. The semiconductor device of claim 1, wherein the interconnect structure includes a first wire and a second wire formed at the same vertical level as each other on the substrate and adjacent to each other,
wherein the first wire and the second wire extend in the first direction, respectively,
wherein the first wire and the second wire are spaced apart from each other in the second direction by a second distance,
a sum of a width of the first portion of the first bent portion in the second direction and the first distance is equal to a sum of a width of the second wire in the second direction and the second distance, and
wherein the width of the first portion is smaller than the width of the second wire.

3. The semiconductor device of claim 1, wherein the second metal pattern includes a fourth portion extending in the second direction, and a fifth portion extending in the second direction and being formed on both sides of and adjacent to the fourth portion in the first direction,
wherein the fourth portion is physically connected to the first metal pattern and the third metal pattern, and
wherein the fifth portion is not physically connected to the fourth portion.

4. The semiconductor device of claim 1, wherein the third metal pattern includes a second bent portion in U shape.

5. The semiconductor device of claim 1, wherein the first metal pattern further includes a third portion extending in the first direction and physically connected to the second portion, and
    wherein the first portion is disposed between the second portion and the third portion.

6. The semiconductor device of claim 1, wherein the interconnect structure includes a first wire and a second wire adjacent to the first wire,
    wherein the first distance is greater than a second distance between the first wire and the second wire in the second direction, and
    wherein the width of the second portion in the second direction is smaller than a width of the first wire in the second direction.

7. The semiconductor device of claim 6, wherein a width of the first via in the first direction is greater than a width of the first portion in the second direction.

8. The semiconductor device of claim 6, wherein the interconnect structure further includes a third wire and a third via connected to the third wire to a fourth wire formed at the second vertical level, and
    wherein a width of the first via in the second direction is greater than a width of the third via in the second direction.

* * * * *